United States Patent [19]

Shoji

[11] 4,320,409
[45] Mar. 16, 1982

[54] COMPLEMENTARY FIELD-EFFECT TRANSISTOR INTEGRATED CIRCUIT DEVICE

[75] Inventor: Masakazu Shoji, Warren, N.J.

[73] Assignee: Bell Telephone Laboratories, Incorporated, Murray Hill, N.J.

[21] Appl. No.: 145,611

[22] Filed: May 1, 1980

[51] Int. Cl.³ .......................................... H01L 27/02
[52] U.S. Cl. ........................................ 357/42; 357/41; 357/52; 357/23
[58] Field of Search ................... 357/42, 52, 41, 23

[56] References Cited

U.S. PATENT DOCUMENTS

| | | | |
|---|---|---|---|
| 3,983,620 | 10/1976 | Spadea | 357/42 X |
| 4,063,274 | 12/1977 | Dingwall | 357/42 X |
| 4,161,417 | 7/1979 | Yim | 357/42 |
| 4,167,747 | 9/1979 | Satow | 357/42 |
| 4,173,767 | 11/1979 | Stevenson | 357/41 X |
| 4,223,334 | 9/1980 | Gasner | 357/52 X |
| 4,240,093 | 12/1980 | Dingwall | 357/42 |

*Primary Examiner*—Martin H. Edlow
*Attorney, Agent, or Firm*—Arthur J. Torsiglieri

[57] ABSTRACT

A CMOS integrated circuit structure having an improved guardband configuration for the prevention of parasitic SCR latchup. Included with each guardband is a pair of field reducing surface regions of the opposite conductivity type to that of the guardband and situated one on each side of the guardband adjacent thereto. The field reducing regions which are electrically connected to each other serve to reduce any electric fields in the bulk region underlying the guardband thereby significantly improving the effectiveness of the guardband for collecting minority carriers in the bulk region to provide greater protection from latchup.

7 Claims, 5 Drawing Figures

COMPLEMENTARY FIELD-EFFECT TRANSISTOR INTEGRATED CIRCUIT DEVICE

BACKGROUND OF THE INVENTION

This invention relates to complementary field-effect transistor integrated circuit structures, and more particularly to a structure having an improved guardband configuration for greater protection from parasitic pnpn latchup.

Integrated circuits using complementary metal-oxide-semiconductor (CMOS) transistors are well known. Such circuits which combine both p- and n-channel enhancement mode transistors on the same substrate chip offer high performance, low standby power dissipation, high noise immunity and single power supply operation. Owing to these desirable characteristics, CMOS circuits are now widely used in a variety of applications such as random access memories and microprocessors. At present, CMOS circuits having extremely high packing density of devices on a single chip are being developed.

One problem with CMOS circuits is that parasitic active elements which are inherently a part of conventional CMOS structures can cause very large currents to flow between the power supply terminals of the circuit. In a conventional CMOS structure, p-channel devices are formed in the surface of an n-type bulk substrate wafer and n-channel devices are formed in the surface of a p-type tub region formed in the substrate. When a p-channel device and an n-channel device are placed in close proximity, the p-type source and drain regions of the p-channel device, the n-type bulk substrate region, the p-type bulk tub region and the n-type source and drain regions of the n-channel device form a pnpn structure which can operate as a silicon-controlled rectifier (SCR). This parasitic SCR can be triggered into a self-sustained high conductivity state known as the latchup state by noise signals of appropriate polarity and magnitude applied to the source or drain regions of the transistors. For example, latchup can be triggered by a noise transient pulse having a voltage whose magnitude exceeds that of the power supply voltage and which is picked up by an external terminal of the CMOS circuit. Once triggered, latchup of the parasitic SCR continues until the power supply voltages of the CMOS circuit are removed or are greatly reduced. The results of latchup are temporary malfunction of the CMOS circuit or, in some cases, permanent circuit damage.

Another characteristic of the latchup problem is that as the spacing between the p- and n-channel devices and the dimensions of the devices themselves are made smaller in order to achieve a higher circuit packing density, the parasitic SCR becomes more easily triggered. Consequently, as the packing density of a conventional CMOS circuit is increased, the circuit becomes more susceptible to latchup. Therefore, the latchup problem also imposes a limitation on the maximum packing density achievable with conventional CMOS structures.

A prior art solution to the latchup problem in CMOS circuits is to form relatively heavily doped p- and/or n-type annular regions called guardbands in the substrate and tub regions, respectively, and interposed between the p- and n-channel devices. The guardbands which are appropriately biased serve as collectors of minority carriers in their respective underlying regions to inhibit parasitic SCR action and raise the trigger threshold for latchup. The degree of latchup protection provided by the guardbands depends largely on their effectiveness in collecting minority carriers.

The prior art guardband structure consists of a p-type guardband in the n-type substrate surrounding the n-channel devices and/or an n-type guardband in the p-type tub region surrounding the n-channel devices. The prior art guardband structure is deficient in that the effectiveness of each guardband in collecting minority carriers can be diminished by the presence of transverse electric fields (i.e., electric fields having components parallel to the semiconductor surface) in the regions underlying the guardband. Inasmuch as transverse electric fields from a variety of origins such as voltage drops caused by junction leakage currents and capacitively coupled signal voltages are usually present in the bulk semiconductor regions of an operating CMOS circuit, the prior art guardband structure is hindered from being fully effective for collecting minority carriers. Owing to this deficiency, the prior art guardband configuration which is adequate for preventing latchup in CMOS circuits having the present packing density of devices becomes less adequate for the circuits having higher packing density that are currently being developed. Therefore, a need clearly exists for an improved guardband structure which is more effective for collecting minority carriers in the presence of a transverse electric field.

SUMMARY OF THE INVENTION

Accordingly, an object of this invention is a CMOS integrated circuit structure for avoiding parasitic SCR latchup and which is suitable for use in circuits having a very high packing density of devices.

A further object of this invention is a guardband configuration which remains substantially fully effective for collecting minority carriers in the presence of a transverse electric field.

In accordance with the present invention there is provided a CMOS integrated circuit device comprising a silicon body having an n-type bulk region extending from a surface thereof, a p-type bulk region extending from the surface, a pair of complementary transistors adjacent the surface, one of the pair being a p-channel device having spaced p-type source and drain situated in the n-type bulk region, the other of the pair being an n-channel device having spaced n-type source and drain situated in the p-type bulk region, a relatively heavily doped p-type guard region adjacent the surface in the n-type bulk region interposed between the complementary pair of transistors and/or a relatively heavily doped n-type guard region adjacent the surface in the p-type bulk region interposed between the complementary pair of transistors characterized in that there are included surface means associated with each guard region for reducing any electric fields in the bulk region underlying such guard region.

In an illustrative embodiment only a p-type guard region is used and the field reducing means comprise a pair of relatively heavily doped n-type regions located one on each side of the guard region and adjacent thereto. These n-type guard regions which are laterally coextensive with the guard region are electrically coupled to each other via a metallic surface connection.

BRIEF DESCRIPTION OF THE DRAWING

The present invention will be better understood from the following more detailed description taken in conjunction with the accompanying drawing in which.

DETAILED DESCRIPTION

Figure 1:
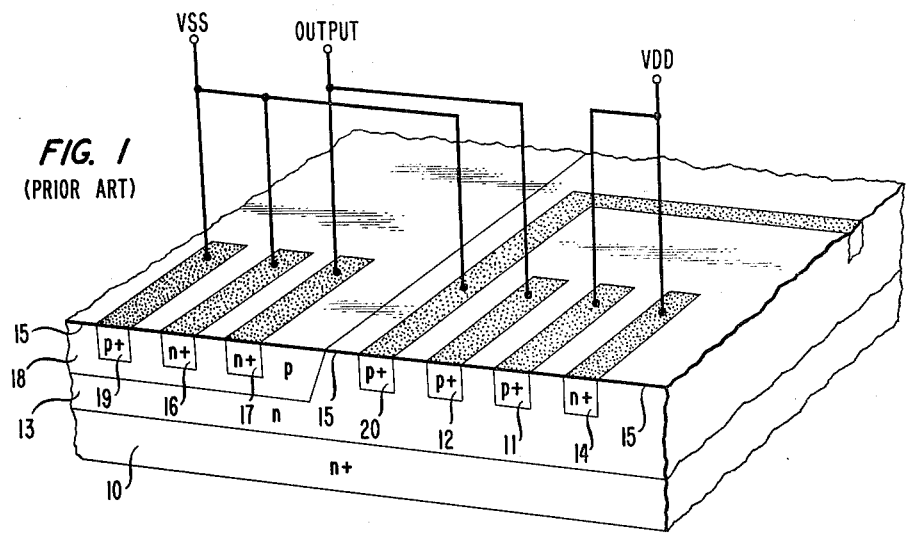
FIG. 1 is a cross-sectional view illustrating a silicon chip having a conventional guardbanded CMOS structure.
Figure 2:
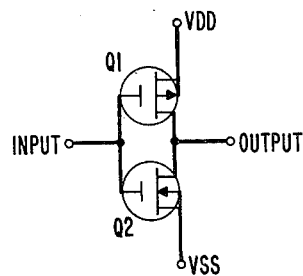
FIG. 2 is a schematic diagram of a known CMOS inverter circuit.

Referring now to FIG. 1 there is shown a conventional guardbanded CMOS structure of the kind in which the latchup protection provided by the guardband configuration used may become inadequate when fabricated in an integrated circuit having a very high packing density device. The structure shown has a p-channel and an n-channel insulated-gate field-effect transistor formed in a silicon body comprising a chip 10 and connected as a complementary pair in an inverter circuit as shown schematically in FIG. 2. For ease of illustration and clarity, the various conductor and insulator layers on the surface of the chip needed to form an operative circuit have been omitted from FIG. 1.

The p-channel transistor comprises relatively heavily doped p-type source and drain 11 and 12, respectively, formed in the surface of a relatively lightly doped n-type bulk region comprising an epitaxial layer 13 which overlies the relatively heavily doped n-type body 10. A relatively heavily doped n-type contact region 14 serves to facilitate making ohmic contact to the n-type bulk region 13 at the surface 15 of the chip.

The n-channel transistor comprises relatively heavily doped n-type source and drain 16 and 17, respectively, formed in the surface 15 of a relatively lightly doped p-type bulk region comprising a tub region 18, the tub region being formed in the n-type bulk region 13. A relatively heavily doped p-type contact region 19 serves to facilitate making ohmic contact to the tub region at the surface of the chip.

In normal operation of the inverter circuit, the source of the p-channel transistor 11 and the n-type bulk region 13 are biased at the highest supply voltage of the circuit, VDD, while the source of the n-channel transistor 16 and the p-type tub region are biased at the lowest supply voltage of the circuit, VSS. The drains of the p- and n-channel transistors 12 and 17, respectively, are both connected to the output terminal of the inverter circuit.

Figure 3:
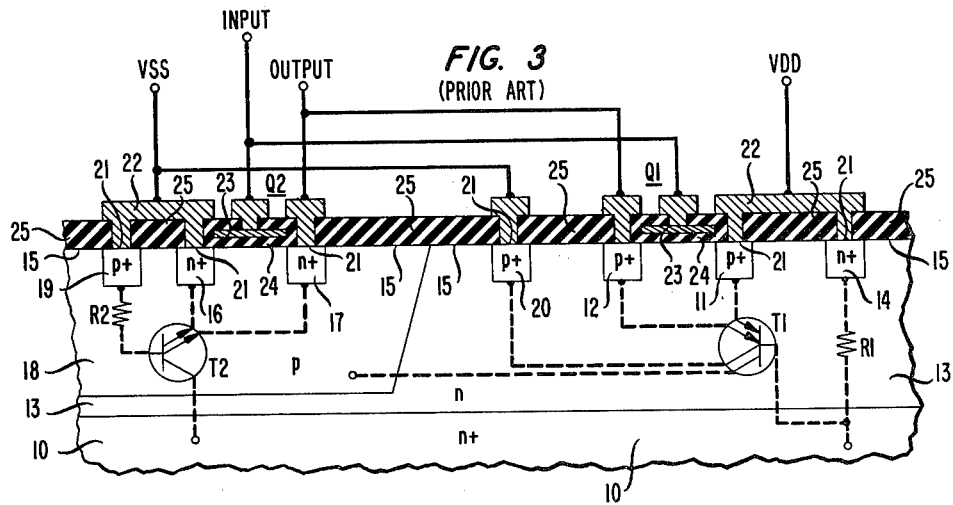
FIG. 3 is a cross-sectional side view illustrating a silicon chip which incorporates an inverter circuit in the conventional guardbanded CMOS structure, the figure also illustrating schematic representations of parasitic elements associated with the guardbanded CMOS structure.

In the conventional guardbanded CMOS structure of FIG. 1, a relatively heavily doped p-type guardband 20 is interposed between the p- and n-channel transistors, the guardband being biased at the VSS supply voltage. The operation of the guardband is now explained with reference to FIG. 3 which is a cross-sectional side view of the structure of FIG. 1. Also included in the depiction of FIG. 3 is a metallic layer which forms the ohmic contacts 21 to the various regions and surface connections 22 of the circuit, a polycrystalline silicon layer 23 which after patterning forms the gates of the p- and n-channel transistors, a gate-oxide layer ($SiO_2$) 24 which after patterning forms the gate insulator regions underlying the gates of the transistors, and a field oxide layer ($SiO_2$) 25 which provides electrical insulation between the metallic surface connections 22 and the silicon surface 15. The gates 23 of transistors Q1 and Q2 are both connected to the input terminal of the inverter circuit.

Also shown in FIG. 3 are schematic representations of the parasitic elements which are inherently a part of the guardbanded CMOS structure. These include a pnp bipolar transistor T1 having two emitters provided by regions 11 and 12, a base provided by a portion of region 13, and two collectors provided by regions 20 and 18; and an npn bipolar transistor T2 having two emitters provided by regions 16 and 17, a base provided by a portion of region 18 and a collector provided by region 13. During operation of the CMOS circuit, the VDD supply voltage is applied directly to one emitter of T1 and to the base of T1 through a resistor R1 representing the resistance between region 14 (through regions 13 and 10) and the base of T1. The VSS supply voltage is applied directly to one emitter of T2 and to the base of T2 through a resistor R2 representing the resistance between region 19 (through region 18) and the base of T2. The VSS supply is also applied directly to one of the collectors of T1.

Figure 4:
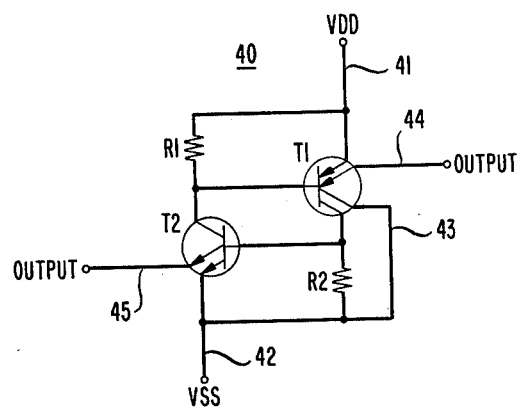
FIG. 4 is a schematic diagram of the equivalent circuit formed by parasitic elements of the guardbanded CMOS structure.

Referring now to FIG. 4, there is shown a schematic diagram of a circuit 40 formed by the parasitic elements of the structure of FIGS. 1 and 3. Except for the second collector 43 of T1, which is introduced by the presence of the guardband 20, the circuit is the well known equivalent circuit of a silicon controlled rectifier (SCR) having its anode 41 connected to the VDD supply, its cathode 42 connected to the VSS supply, and its anode gate 44 and cathode gate 45 both connected to the output terminal of the CMOS inverter circuit. Such an SCR circuit can be triggered into its conduction state by appropriate current signals picked up on the output terminal. For example, if the output terminal receives a transient pulse having a voltage sufficiently greater than VDD, T1 is driven into conduction causing current to flow through R2. If the current through R2 were sufficiently large, the voltage drop across R2 would drive T2 into conduction causing current to flow through R1. If the current through R1 were sufficiently large, the voltage drop across R1 would maintain T1 in its conduction state even after the transient pulse has passed. Thus, under appropriate conditions once the SCR circuit is triggered, each transistor acts to keep the other in its conduction state and the SCR circuit remains latched until the bias voltage across the circuit (VDD-VSS) is interrupted or reduced below the level required to sustain the conduction state. The SCR circuit may also be triggered by a transient pulse having a voltage sufficiently lower than VSS which when applied to the output terminal would initiate latchup by driving T2 into conduction.

The additional collector 43 of parasitic transistor T1 provided by the guardband region inhibits latchup by shunting transistor current away from resistor R2 to reduce the voltage drop across R2. Referring again to FIG. 3, current conduction in T1 takes place through the injection of minority carriers (holes) by regions 11 and/or 12, the transport of such carriers mainly by diffusion through region 13, and the collection of such carriers by the tub region 18. The guardband region 20 reduces the current through R2 by collecting a portion of the injected minority carriers which pass beneath the guardband before they reach the tub region 18. The transport of minority carriers between the injecting regions and the tub region is also reduced by the relatively heavily doped substrate 10 which provides a recombination plane for minority carriers in the bulk region 13.

However, as the injecting regions 11 and 12 are moved closer to the tub region 18 in order to provide a higher packing density of devices in the CMOS circuit, the flux of minority carriers passing beneath the guardband when T1 is conducting is increased causing a greater number of the minority carriers to reach the tub region. As a result, the current through R2 is increased despite the guardband. Therefore, the degree of latchup protection provided by the guardband is decreased as the packing density of the circuit is increased.

The present invention provides a guardband structure which is more effective in the collection of minority carriers and which affords greater latchup protection in high density CMOS circuits. I have discovered that the effectiveness of the conventional guardband structure is diminished by the presence of transverse electric fields in the bulk region underlying the guardband. These fields originate from a variety of sources including voltage drops caused by junction leakage currents and time-varying voltages on the drain electrodes of the p- and n-channel devices which are capacitively coupled into the n-type bulk region. Although the magnitudes of these transverse electric fields are quite small, they can, nevertheless, impart significant transverse velocity to the minority carriers so as to hinder the collection of such carriers by the guardband and to aid in their transport to the tub region. Therefore, the effectiveness of guardbands for latchup protection can be substantially improved if there are provided means for reducing the transverse electric fields in the region beneath the guardband.

Figure 5:
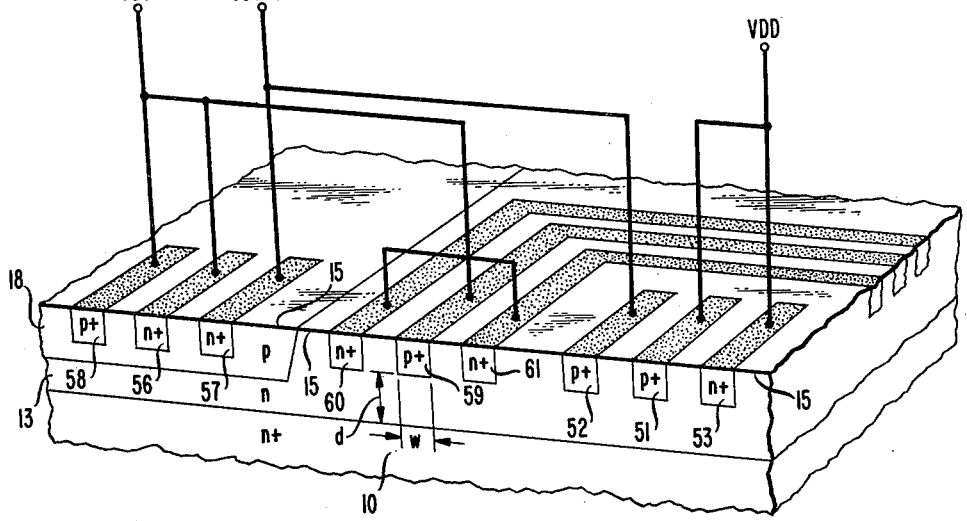
FIG. 5 is a cross-sectional view illustrating a silicon chip having a novel guardbanded CMOS structure in accordance with the present invention.

Referring now to FIG. 5, there is shown a cross-sectional view of a silicon chip depicting the preferred embodiment of the instant invention. As with the structure shown in FIG. 1, a complementary pair of transistors are formed in a silicon substrate chip 10 and connected as an inverter circuit. Once again for clarity and ease of illustration, the various conductor layers and insulator layers at the surface of the chip are not shown.

The p-channel transistor comprises relatively heavily doped p-type source and drain regions 51 and 52, respectively, formed in the surface of a relatively lightly doped n-type epitaxial layer 13 which overlies a relatively heavily doped n-type substrate 10. A relatively heavily doped n-type contact region 53 facilitates making ohmic contact to the n-type bulk region at the surface 15 of the chip.

The n-channel transistor comprises relatively heavily doped n-type source and drain 56 and 57, respectively, formed in the surface of a relatively lightly doped p-type tub region 18 which is formed in the n-type bulk region 13. A relatively heavily doped p-type region 58 facilitates making ohmic contact to the tub region at the surface of the chip.

A relatively heavily doped p-type guardband 59 is formed in the n-type bulk region interposed between the p- and n-channel devices. Now additionally associated with the guardband are a pair of relatively heavily doped n-type field reducing regions 60 and 61 formed in the n-type bulk region, a different one situated on each side of the guardband and coextensive therewith. The field reducing regions 60 and 61 which are electrically connected to each other by surface metallization (shown schematically) serve to equalize the potential of the n-type bulk region in the vicinity of the guardband and thereby reduces any electric fields in the region beneath the guardband. The field reducing regions may either be floating or biased at VDD, in either case the effectiveness of the guardband in collecting minority carriers in the n-type bulk region is significantly increased.

It is advantageous to space the field reducing regions 60 and 61 apart from the guardband region 59 and from the tub region 18 in order to minimize junction leakage currents in the CMOS circuit. The spacing used would be the minimum permitted by the design rules of the particular fabrication process being used. However, in some instances it may be preferrable from the standpoint of reducing chip area to have the regions 60 and 61 in contact with region 59 and to have region 60 in contact with region 18.

Although in the preferred embodiment the CMOS circuit components are formed in the surface of an epitaxial layer, the principles of the present invention can be used to improve latchup protection in a structure where the circuit components are formed directly in the surface of a chip which does not include an epitaxial layer. However, where an epitaxial layer is used, it is advantageous to form the guardband region 59 to have a lateral with (denoted by w in FIG. 5) which is at least four times the vertical distance between the bottom of the guardband region and the surface of the substrate (denoted by d in FIG. 5), in which case substantially all of the minority carriers injected by region 51 and/or region 52 are prevented from reaching the tub region 18.

In some instances it may be preferrable to use an n-type guardband situated in the tub region and biased at VSS instead of the p-type guardband 59 shown in FIG. 5. In other instances it may be preferrable to use both a p-type and an n-type guardband in the same circuit. In either instance field reducing regions in accordance with this invention may be advantageously used with each type of guardband. In the case of an n-type guardband, the field reducing regions would be a pair of relatively heavily doped p-type regions coextensive with the guardband situated one on each side of the guardband and electrically connected to each other. The field reducing regions for the n-type guardband may either be floating or biased at VSS.

It will be appreciated that the circuit structure shown in FIG. 5 represents only a small portion of a CMOS integrated circuit which would typically include many more complementary pairs of transistors, and that the invention is applicable not only to the inverter circuit but to other forms of complementary IGFET circuits as well. For some applications it may not be necessary to provide guardbands to separate all adjacent complementary pairs of transistors in the circuit where only those pairs which have their drains connected to the external terminals of the circuit chip are subject to transient noise pulses which can trigger latchup. Therefore, for such circuits it may be preferrable to separate only those pairs of complementary transistors having drains connected to external terminals with guardbands.

It will be understood by those skilled in the art that the foregoing and other modifications and changes may be made to the described embodiments without departing from the spirit and scope of the invention. For example, the complementary IGFET circuit may be formed by providing an n-type tub region in a p-type bulk region; other materials may be substituted for the substrate, the gate insulator layer, the field insulator layer, and the gate electrode; and numerous techniques are available for forming the various regions of the device.

I claim:

1. A complementary field-effect transistor integrated circuit device comprising a semiconductive body having a first bulk region of a first conductivity type extending from a surface of the body; a second bulk region of a second conductivity type opposite to the first conductivity type extending from the surface; a pair of complementary transistors adjacent to the surface, one of the pair having spaced source and drain of the first conductivity type situated in the second bulk region, the other of the pair having spaced source and drain of the second conductivity type situated in the first bulk region; a relatively heavily doped first guard region of the second conductivity type adjacent the surface in the first bulk region interposed between the pair of transistors; and/or a relatively heavily doped second guard region of the first conductivity type adjacent the surface in the second bulk region and interposed between the pair of transistors;

characterized in that there are included surface means associated with each of the first and second guard regions for reducing any electric fields in the bulk region underlying the guard region.

2. An integrated circuit device according to claim 1 further characterized in that the means for reducing electric fields associated with each guard region comprise a pair of relatively heavily doped field reducing regions of a conductivity type opposite to that of the associated guard region situated one on each side of the associated guard region and adjacent thereto and means for electrically coupling the field reducing regions to each other.

3. An integrated circuit device according to claim 2 further comprising first and second voltage supply terminals; first and second contact regions of the first and second conductivity types, respectively disposed in the first and second bulk regions wherein the first contact region, the second conductivity type source, and the second conductivity type guard region are coupled to the first voltage terminal and the second contact region, the first conductivity type source, and the first conductivity type guard region are coupled to the second voltage terminal.

4. An integrated circuit device according to claim 3 wherein the first bulk region comprises a relatively lightly doped epitaxial layer overlying a relatively heavily doped body region and the second bulk region being formed in the epitaxial layer extending from an exposed surface thereof.

5. An integrated circuit device according to claim 4 further characterized in that the second conductivity type guard region extends from the surface of the epitaxial layer but is vertically spaced from the body region, the second conductivity guard region being formed to have a lateral width which is at least four times greater than the vertical spacing between the guard region and the body region.

6. An integrated circuit device according to claim 5 further characterized in that the field reducing regions associated with each guard region are substantially laterally coextensive with the associated guard region.

7. An integrated circuit device according to claim 5 wherein the first conductivity type is p-type, the second conductivity type is n-type and the body region is n-type.

* * * * *